US006908512B2

United States Patent
Ivanov et al.

(10) Patent No.: US 6,908,512 B2
(45) Date of Patent: Jun. 21, 2005

(54) TEMPERATURE-CONTROLLED SUBSTRATE HOLDER FOR PROCESSING IN FLUIDS

(75) Inventors: Igor C. Ivanov, Dublin, CA (US); Jonathan Weiguo Zhang, San Jose, CA (US); Artur Kolics, San Jose, CA (US)

(73) Assignee: Blue29, LLC, Sunnyvale, CA (US)

( * ) Notice: Subject to any disclaimer, the term of this patent is extended or adjusted under 35 U.S.C. 154(b) by 180 days.

(21) Appl. No.: 10/247,895

(22) Filed: Sep. 20, 2002

(65) Prior Publication Data

US 2004/0084143 A1 May 6, 2004

(51) Int. Cl.[7] .............................................. G05C 13/00
(52) U.S. Cl. ............................ 118/503; 34/68; 34/78; 118/52; 118/66; 118/69
(58) Field of Search ...................... 204/241; 118/725, 118/59, 50, 500, 503, 64, 66, 69, 61, 730, 52; 427/443.1, 437; 165/80.1–80.4; 34/380, 68, 78, 60

(56) References Cited

U.S. PATENT DOCUMENTS

| | | | |
|---|---|---|---|
| 4,771,730 A | * | 9/1988 | Tezuka |
| 4,903,754 A | * | 2/1990 | Hirscher et al. |
| 4,909,314 A | * | 3/1990 | Lamont, Jr. |
| 5,177,878 A | | 1/1993 | Visser |
| 5,267,607 A | * | 12/1993 | Wada |
| 5,458,687 A | * | 10/1995 | Shichida et al. |
| 5,500,315 A | | 3/1996 | Calvert et al. |
| 5,775,416 A | | 7/1998 | Heimanson et al. |
| 5,830,805 A | | 11/1998 | Shacham-Diamand et al. |
| 5,950,723 A | * | 9/1999 | Heimanson et al. |
| 6,012,509 A | * | 1/2000 | Nonaka |
| 6,042,712 A | | 3/2000 | Mathieu |
| 6,322,677 B1 | | 3/2001 | Woodruff et al. |
| 6,309,524 B1 | | 10/2001 | Woodruff et al. |
| 2003/0134047 A1 | | 7/2003 | Dubin et al. |

FOREIGN PATENT DOCUMENTS

WO    WO 02/34962    5/2002

OTHER PUBLICATIONS

U.S. Appl. No. 103,015, filed Mar. 22, 2002, Ivanov.*
Electroless Nickel Plating, Finishing Publications, Ltd 1991, by W. Riedel, p. 39.
"Microelectronic Engineering", No., 50(2000) pp. 441–447 by Y. Lantasov.
AMC 2001 by S. Lopatin.
International Search Report, application No. PCT/US03/26697, mailed Feb. 23, 2004.

* cited by examiner

*Primary Examiner*—Brenda A. Lamb
(74) *Attorney, Agent, or Firm*—Mollie E. Leitang; Daffer McDaniel, LLP

(57) ABSTRACT

A substrate holder has a disk-like body with a central recess having diameter smaller than the diameter of the substrate placed onto the upper surface of the holder. The substrate can be clamped in place by the clamps of the edge-grip mechanism or placed into a seat without the use of clamps. In both cases, the substrate forms a partial wall that confines the heating/cooling recess or chamber. The aforementioned recess is filled with a cooling or heating liquid (depending on the mode of metal deposition) selectively supplied from a liquid heating or cooling system. In order to ensure in the working chamber above the substrate a pressure slightly higher than the pressure in the cooling/heating recess, the working chamber is first filled with the working solution under the atmospheric pressure, and then the recess is filled with a heating or cooling liquid with simultaneous increase of pressure in the working chamber to a level slightly exceeding the pressure in the recess. The substrate holder of the invention provides direct heat/cool-exchange between the heating/cooling medium and the substrate and allows instantaneous change of temperature of the heating/cooling liquid.

20 Claims, 5 Drawing Sheets

TEMPERATURE-CONTROLLED SUBSTRATE HOLDER FOR PROCESSING IN FLUIDS

FIELD OF THE INVENTION

The present invention relates to the field of semiconductor production, in particular, to a temperature-controlled substrate holder for processing in fluids, e.g., to electroplating, electroless deposition of thin metal films onto semiconductor substrates, chemical mechanical polishing, or similar processes which involve treatment of a workpiece in a fluid such a chemical solution, or a liquid slurry. Furthermore, the invention relates to a method of direct heating/cooling of a workpiece in the aforementioned processes.

BACKGROUND OF THE INVENTION

Manufacturing of semiconductor devices, in particular integrated circuits having multiple-layered structures with various metal and non-metal layers laminated on a semi-conductor substrate, typically involves an application of several metal layers onto a substrate or onto other previously deposited layers. These layers may have a complicated planar topology since these layers may constitute thousands of individual devices, which in combination form an integrated circuit or so-called "chip". Modern chips may have metal or dielectric layers with thicknesses from tens of Angstroms to fractions of a micron.

It is understood that thin metallic films used in integrated circuits of semiconductor devices function as conductors of electric current. Furthermore, it is known that densities of signal currents in metallic interconnections used in integrated circuits may reach extremely high values that generate such phenomena as electromigration associated with spatial transfer of mass of conductor films. Therefore the characteristics and properties of the deposited metal films (uniformity of film thickness, low electrical resistivity, etc.) determine performance characteristics and quality of the integrated circuit and of the semiconductor device as a whole.

In view of the above, thin metal films used in integrated circuits should satisfy very strict technical requirements relating to metal deposition processes, as well as to repeatability and controllability of the aforementioned processes.

A wide range of metals is utilized in the microelectronic manufacturing industry far the formation of integrated circuits. These metals include, for example, nickel, tungsten, platinum, copper, cobalt, as well as alloys of electrically conductive compounds such as silicides, solders, etc. It is also known that coating films are applied onto substrates with the use of a variety of technological processes such chemical vapor deposition (CVD), physical vapor deposition (PVD), electroplating, and electroless plating. Of these techniques, electroplating and electroless plating or deposition tend to be the most economical and most promising for improvement in characteristics of the deposited films. Therefore, electroplating and electroless plating techniques successfully replace other technologies.

Electroplating and electroless plating can be used for the deposition of continuous metal layers as well as patterned metal layers. One of the process sequences used by the microelectronic manufacturing industry to deposit metals onto semiconductor wafers is known to as "damascene" processing. In such processing, holes, commonly called "vias", trenches and/or other recesses are formed on a workpiece and filled with a metal, such as copper. In the damascene process, the wafer, with vias and trenches etched in the dielectric material, is first provided with a metallic seed layer, which is used to conduct electrical current during a subsequent metal electroplating step. If a metal such as copper is used, the seed layer is disposed over a barrier layer material, such as Ti, TiN, etc. The seed layer is a very thin layer of metal, which can be applied using one or more processes. For example, the seed layer of metal can be laid down using physical vapor deposition or chemical vapor deposition processes to produce a layer with the thickness on the order of 1,000 Angstroms. The seed layer can advantageously be formed of copper, gold, nickel, palladium, or other metals. The seed layer is formed over a surface, which may contain vias, trenches, or other recessed device features.

A metal layer is then electroplated onto the seed layer in the form of a continuous layer. The continuous layer is plated to form an overlying layer, with the goal of providing a metal layer that fills the trenches and vias and extends a certain amount above these features. Such a continuous layer will typically have a thickness on the order of 5,000 to 15,000 Angstroms (0.5–1.5 microns).

After the continuous layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step, which uses the combined action of chemical removal agents, or a chemical removal agents with an abrasive, which grinds and polishes the exposed metal surface to remove undesired parts of the metal layer applied in the electroplating step.

Disadvantages associated with electroplating are technical problems in connection with designing of reactors used in the electroplating of semiconductor wafers. Utilization of a limited number of discrete electrical contacts (e.g., 8 contacts) with the seed layer about the perimeter of the wafer ordinarily produces higher current densities near the contact points than at other portions of the wafer. This non-uniform distribution of current across the wafer, in turn, causes non-uniform deposition of the plated metallic material. Current thieving, affected by the provision of electrically conductive elements other than those, which contact the seed layer, can be employed near the wafer contacts to minimize such non-uniformity. But such thieving techniques add to the complexity of electroplating equipment, and increase maintenance requirements.

The specific metal to be electroplated can also complicate the electroplating process. For example, electroplating of certain metals typically requires use of a seed layer having a relatively high electrical resistance. As a consequence, use of the typical plurality of electrical wafer contacts (for example, eight discrete contacts) may not provide adequate uniformity of the plated metal layer on the wafer. Reduction in sizes of such features as vias and trenches also requires thinner layers having higher resistivity, which in turn may generate a high potential drop from the wafer edges to the central part, whereby the rate of deposition in the central area is significantly reduced.

Beyond the problems discussed above, there are also other problems associated with electroplating reactors. As device sizes decrease, the need for tighter control over the processing environment increases. This includes control over the contaminants that affect the electroplating process. The moving components of the reactor, which tend to generate such contaminants, should therefore be subject to strict isolation requirements.

Still further, existing electroplating reactors are often difficult to maintain and/or reconfigure for different electroplating processes. Such difficulties must be overcome if an electroplating reactor design is to be accepted for large-scale manufacturing.

One drawback associated with copper deposition by electroplating is the fact that for very small features on microelectronic workpieces (sub 0.1 micron features), copper deposition by electroplating can lack conformity with the side walls of high aspect ratio vias and trenches, and can produce voids in the formed interconnects and plugs (vias). This is often due to the non-conformity of the copper seed layer deposited by PVD or CVD. As a result, the seed layer may not be thick enough to carry the current to the bottom of high aspect ratio features.

An alternate process for depositing copper onto a microelectronic workpiece is known as "electroless" plating which is the deposition of metals on a catalytic surface from a solution without an external source of current. For example, this process can be used as a preliminary step in preparing plastic articles for conventional electroplating. After cleaning and etching, the plastic surface is immersed in solutions that react to precipitate a catalytic metal in situ, palladium, for example. First the plastic is placed in an acidic stannous chloride solution, then into a solution of palladium chloride; palladium is reduced to its catalytic metallic state by the tin. Another way of producing a catalytic surface is to immerse the plastic article in a colloidal solution of palladium followed by immersion in an accelerator solution. The plastic article thus treated can now be plated with nickel or copper by the electroless method, which forms a conductive surface, which then can be plated with other metals by a conventional electroplating method.

Along with the electroplating method, the electroless method also has found wide application in the manufacture of semiconductor devices. Since the problem of heating and cooling of a workpiece, such as a semiconductor substrate is especially pertinent for electroless deposition processes, the following description will be continued with specific reference to electroless deposition. It is understood, however, that the electroless process is given only as a example and that the term "temperature controlled substrate holder" is equally applicable to processing in any process that involves treatment of a temperature controlled object in a fluid.

As compared to electroplating, electroless plating or deposition is a selective process, which can be realized with very thin seeds or without the use of seeds at all. Since an electroless process is not associated with the use of an external electric current source, electroless deposition results in more uniform coatings in view of the absence of discrete contacts. Electroless deposition can be realized with the use of simple and inexpensive equipment and with a high aspect ratio gap fill.

Given below are several examples of existing methods and apparatuses for electroless deposition, specifically for use in the manufacture of semiconductor devices.

For example, U.S. Pat. No. 5,500,315 issued in 1996 to J. Calvert, et al. discloses an electroless metal plating-catalyst system that overcomes many of the limitations of prior systems. In one aspect of the invention, the process comprises the steps of: providing a substrate with one or more chemical groups capable of ligating to an electroless deposition catalyst, at least a portion of the chemical groups being chemically bonded to the substrate; contacting the substrate with the electroless metal plating catalyst; and contacting the substrate with an electroless metal plating solution to form a metal deposit on the substrate. The chemical groups can be, for example, covalently bonded to the substrate. In another preferred aspect, the invention provides a process for selective electroless metallization, comprising steps of selectively modifying the reactivity of a substrate to an electroless metallization catalyst; contacting the substrate with the electroless metallization catalyst; and contacting the substrate with an electroless metallization solution to form a selective electroless deposit on the substrate. The substrate reactivity can be modified by selective treatment of catalyst ligating groups or precursors thereof on the substrate, for example by isomerization, photocleavage or other transformation of the ligating or precursor groups. Such-direct modification enables selective plating in a much more direct and convenient manner than prior selective plating techniques. Specifically, the aforementioned patent provides selective electroless deposition without the use of a photoresist or an adsorption type tin-containing plating catalyst.

Although the above method provides selective patterning of substrate ligating groups and although some of practical examples indicate different temperatures of the solution, the invention does not teach methods for optimization of the electroless deposition process by controlling temperature of the solution or substrate holder. Furthermore, the aforementioned invention relates exclusively to a method and does not describe any electroless deposition equipment.

U.S. Pat. No. 6,309,524 granted to D. Woodruff, et al. in 2001 discloses, in one of its embodiments, a universal electroplating/electroless reactor for plating a metal onto surfaces of workpieces. An integrated tool for plating a workpiece comprises a first processing chamber for plating the workpiece using an electroless deposition process and a second processing chamber for plating the workpiece using an electroplating process. A robotic transfer mechanism is used that is programmed to transfer a workpiece to the first processing chamber for electroless deposition thereof and, in a subsequent operation, to transfer the workpiece to the second processing chamber for electroplating thereof.

It should be noted that a common problem in using bathes, which is especially true for the electroless deposition process, is that foreign particles or contaminants will be deposited on the substrate surface of the wafer when transferring the wafers from one bath to another bath. Another common problem is the exposure of the substrate surface of the wafer to air during the transfer (from bath to bath) can cause the non-wetting of deep and narrow trenches in the surface or small (contact) holes in the surface because of electrolyte evaporation. And yet another common problem is that exposure to air may cause oxidation of the catalytic surface that will result in poor catalytic activity and poor quality metal deposits. This problem becomes especially troublesome when using materials such as copper that easily oxidize in air. To produce high quality metal deposits in the submicron range, therefore, it is more desirable not to transfer the wafer between the processing chambers and to avoid exposing the wafer to air by using a single bath or processing chamber and moving the different fluids for each step in the process through the processing chamber. Furthermore, this patent also ignores such an important issue as temperature control of the solution and substrate.

The above problems are solved by the system described in U.S. Pat. No. 5,830,805 issued in 1998 to Y. Shacham-Diamand, et al. This patent discloses an electroless deposition apparatus and method of performing electroless deposition for processing a semiconductor wafer that use a closed processing chamber to subject the wafer to more than one processing fluid while retaining the wafer within the chamber. The invention is useful for manufacturing processes that include depositing, etching, cleaning, rinsing, and/or drying. The processing chamber used in the preferred embodiment of the apparatus of the above patent is an enclosed container capable of holding one or more semiconductor wafers. A distribution system introduces a first fluid into the chamber for processing the wafer and then removes the first fluid from the chamber after processing the wafer. The distribution system then introduces the next fluid into the chamber for processing the wafer and then removes the next fluid from the chamber after processing the wafer. This procedure continues until the manufacturing process finishes. The fluids used in the present invention depends on the process performed and may include fluids such as DI water, $N_2$ for flushing, and electrolytic solutions comprising reducing agents, complexing agents, or pH adjusters.

The fluid enters the sealed processing chamber through an inlet, and exits the chamber through an outlet. As the fluid enters the processing chamber, the fluid is dispersed across the wafer in a uniform flow. A recirculation system moves the fluid through the processing chamber using a temperature control system, chemical concentration monitoring system, pump system, and a filtration system before re-circulating the fluid back through the processing chamber.

Additional embodiments include: a rotatingly mounted tubular wafer housing with a wafer mounted on either or both sides of the housing surface; an inner core mounted inside of the tubular housing when mounting a wafer on the inside surface of the housing; and a dispersal apparatus for dispersing the fluid in a uniform flow over the wafer. The processing chamber can be provided with a heater and a temperature control system. However, the processing chamber is an open-type chamber, which cannot be sealed and therefore does not allow pressure-controlled deposition processes. In addition, the open-type chamber does not provide adequate protection of the process against contamination of the solution.

In spite of their advantages, the known electroless processes have temperature of the working chemical solution as one of the main parameters. It is known that speed of deposition in an electroless process depends on the temperature in a degree close to exponential. For example, an article entitled "Electroless Nickel Plating,." Finishing Publications Ltd., 1991, W. Riedel states (page 39 of the article) that temperature is the most important of parameters affecting the deposition rate and that for a Ni—P electroless process the deposition rate increases twofold for every 10 degrees of bath temperature.

Furthermore, for the metal interconnects on the surface of the wafer one of the major requirements is low resistivity. Copper was chosen as the close second best for fulfilling this requirement however, due to the presence of various additives in the interface between the PVD Cu seeds and ECD (electroplating copper deposition) Cu, resistivity is disproportionally increased as compared to much thinner electroless-deposited Cu layers. This phenomenon was reported by S. Lopatin at AMC, 2001.

It has been also shown by Y. Lantasov, et al. in "Microelectronics Engineering", No. 50 (2000), pp. 441–447, FIG. 2, that resistivity of ELD Cu strongly depends on deposition conditions, and that at higher temperatures it is possible to obtain a material with low resistivity.

However, it is understood that electroless deposition at high temperatures leads to significant non-uniformities in the deposited layers. This occurs due to local temperature fluctuations. The higher is the temperature, the greater are such fluctuations. Stabilizalion of elevated temperatures in large volumes of the solution tanks is associated with the use of complicated temperature control systems and temperature maintaining systems (seals, thermal insulations, This, in turn, increases the cost of the equipment and maintenance.

For the reasons described above, manufacturers of semiconductor equipment prefer to use electroless processes carried out at room temperature. Low speeds of deposition are compensated by utilizing a multiple-station deposition equipment with simultaneous operation of a number of substrates in a number of chambers arranged in series (see, e.g., U.S. Pat. No. 6,322,677 issued in 2001 to D E. Woodruff, et al.). Such equipment requires a large production space and dictates the use of large volumes of the solutions. Furthermore, an additional space is needed for the preparation, storage, and post-use treatment of the solutions. This, in turn, creates environmental problems.

Another common drawback of existing electroless deposition apparatuses is low speed of deposition, which in general depends on the type of the deposited material and even in the best case does not exceed 100 nm/min, but normally is much lower. For example, for COWP the speed of deposition can be within the range from 5 nm/min to 10 nm/min.

In earlier U.S. patent application Ser. No. 10/103,015 filed on Mar. 22, 2002, the applicants have substantially solved the problems of eletroplating and electroless deposition associated with processes and apparatuses described above. More specifically, the apparatus described in the aforementioned patent application has a closable chamber that can be sealed and is capable of withstanding an increased pressure and high temperature. The chamber contains a substrate holder that can be rotated around a vertical axis, and an edge-grip mechanism inside the substrate holder. The deposition chamber has several inlet ports for the supply of various process liquids, such as deposition solutions, DI water for rinsing, etc., and a port for the supply of a gas under pressure. The apparatus is also provided with reservoirs and tanks for processing liquids and gases, as well as with a solution heater and a control system for controlling temperature and pressure in the chamber. The heater can be located outside the working chamber or built into the substrate holder, or both heaters can be used simultaneously. Uniform deposition is achieved by carrying out the deposition process under pressure and under temperature slightly below the boiling point of the solution. The solution can be supplied from above via a showerhead formed in the cover, or through the bottom of the chamber. Rinsing or other auxiliary solutions are supplied via a radially moveable chemical dispensing arm that can be arranged above the substrate parallel thereto.

The apparatus of U.S. patent application Ser. No. 10/103, 015 provides uniform heating of the entire working solution by means of a heater located either outside of the deposition chamber with heating of the solution on the way to the chamber, or inside the cover of the deposition chamber. The main idea is to maintain the entire volume of the working solution at a uniform temperature. In general, the temperature can be adjusted, but should remain constant and at a relatively high level (e.g., 80 to 90° C.) all the time. However, although an elevated temperature of the working solution leads to essential increase in the productivity of the deposition process, the process requires constant replacement of the working solution since high temperature causes rapid thermal decomposition of the solution. Constant replacement of the solution should be carried out with high flow rates, and this, in turn, increases the cost of the production.

The undesired effect of permanent high temperature on the working solution can be explained as follows: Electroless deposition is a process of reduction of metal ions, e.g., cobalt, tungsten, or the like, on the catalytically-active surface by electrons released during oxidation of a reducing agent (e.g., hypophosphite anions). Oxidation of the reducing agent is catalyzed by a substrate, and, in the case of the most widely accepted model, it can be assumed that the charge from the reducing agent is transferred to metal ions through the substrate and thus produces metal atoms on the substrate surface.

A simplified combined chemical reaction for the above process can be expressed as follows:

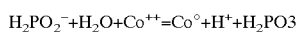

$$H_2PO_2^- + H_2O + Co^{++} = Co° + H^+ + H_2PO3$$

The reducing agent is consumed by deposition of metal on the processed part, by hydrolysis at high temperature (especially on hot spots of heating elements), by catalytic oxidation on particles generated by the deposition tool hardware, and by a reaction of the reducing agent with reactive components (such as ethylene bonds, carboxyl groups. etc.) of the polymers used in tool construction.

At a sufficiently high concentration of contamination particles and/or at the boiling point of the solution, the composition can be spontaneously and completely decomposed by metal reduction at the surfaces of the aforementioned particles (and defects). As soon as few metal atoms are formed, they become new nucleation sites for further continuous decomposition of the solution.

International Patent Application Publication No. WO 02/34962 (hereinafter referred to as International Application) disclosed on May 2, 2002 describes an electroless apparatus, in which the problem of thermal decomposition of the working solution is partially solved by utilizing a substrate holder with a heating device. The substrate holder of this apparatus has a substrate chuck for clamping the substrate during deposition in the working chamber in a position of the treated surface facing down.

The main disadvantage of the apparatus of the aforementioned International Application is that the substrate is oriented with the treated surface facing down. It is known that in a static condition of the solution or in processes with low-velocity flows of the solution, the aforementioned orientation of the substrate leads to accumulation of gas bubbles on the treated surface. The gas bubbles, in turn, violate conditions required for uniformity of deposition. In order to solve this problem, in the apparatus of the International Application the deposition chamber has a curvilinear bottom surface for guiding the flows of the working solution in specific paths over the facing-down surface of the substrate. However, even though the flows of the working solution generate some dynamic conditions on the edge surfaces of the substrate, a certain stagnation point will always remain in the central part of the substrate. This local area may accumulate gas bubbles. Furthermore, differential of velocities of the flow on the substrate surface may lead to non-uniform temperature distribution. In other words, the apparatus of the International Application does not provide uniformity of electroless deposition.

In order to eliminate problems associated with accumulation of gas bubbles and stagnation of the solution in the central area of the chuck, one of the embodiments of the aforementioned apparatus includes a complicated kinematic system with wobbling motions of the rotating chuck. Such a complicated system makes the apparatus and products more expensive, while the process becomes difficult to control.

The disadvantages of the aforementioned International Application are eliminated by the substrate chuck disclosed in the U.S. patent application Ser. No. 10/24,331 filed by the same applicant and now pending. This application describes an apparatus based on the use of a substrate holder with a heater and cooler built into the body of the holder for selective cooling or heating of the surface of the substrate supported by the holder. According to one embodiment, the substrate holder has an electric-resistance type heater built into the chuck body. The supply of electric current to the heater is carried out through sliding current contacts which are connected to the heater by conductors and which are in contact with current collecting rings on the rotating shaft of the chuck. The chuck also contains a cooling unit built into its body below the heater and intended for rapid cooling of the chuck, when it may be required by a technological process. The cooling unit can be made in the form of a spiral channel for the passage of a cooling medium such as deionized water or the like. For this purpose, the cooling unit may be connected to a reservoir with a coolant. Circulation of the coolant is ensured by a provision of a pump installed in a line between the reservoir and the cooling unit. A manifold for collection and distribution of the coolant between the reservoir and the cooling unit consists of a stationary part and a rotating part attached to the shaft with respective sealing devices therebetween.

Although the device of this embodiment can be efficiently used for quick cooling of the heater, the heat is transferred to the substrate indirectly, i.e., through the material of the chuck. Another disadvantage is a complicated construction that requires electrical wiring inside the chuck body together with the formation of channels for the passage of the cooling fluid.

In the second embodiment of the temperature-controlled chuck for electroless deposition disclosed in U.S. patent application Ser. No. 10/242,331, a cooling unit and a heating unit are combined into a single Peltier-type cooler-heater, which is built into the body of the chuck and comprises a package of two semiconductor plates. These plates operate on the principle of generation of heat, when the current flow in one direction, and of absorption of heat, when the current flows in the opposite direction. Direction of the current is changed through the use of a switch that changes polarity on the semiconductor plate. A provision of the Peltier-type heater-cooler makes it possible not only to heat the working surface of the chuck, and hence of the substrate W, but also to quickly cool the holder surface and the substrate W.

In this device, similar to the previous one, heating and cooling are carried out indirectly via the material of the chuck body and therefore the construction of the cooler/ heater that incorporates a Peltier-type unit possesses some cooling and heating inertia.

U.S. Pat. No. 5,775,416 issued in 1998 to D. Heimanson, et al., describes a temperature controlled chuck for vacuum processing that includes a heating unit and a cooling unit, both with the use of a gas. A first cavity separates the heating unit from a wafer substrate, and a second cavity separates the cooling unit from the heating unit. A gas delivery system conducts gas to the first cavity to facilitate exchange of heat between the heating unit and the substrate. A second gas delivery system conducts fluid to the second cavity to facilitate exchanges of heat between the heating unit and the cooling unit. A control system raises the temperature of the substrate by increasing power to the heating unit and by evacuating gas from the second cavity and lowers the temperature of the substrate by reducing power to the heating unit and by conducting gas to the second cavity.

An advantage of such a cooling/heating system is that the gas is maintained in a direct heat-transfer relationship with the wafer as it is supplied to a heating/cooling chamber, one wall of which is defined by the bottom of the wafer. However, this device utilizes gas as a cooling and heating medium inside the substrate holder itself. Increase of temperature is carried out through a built-in electrical heater, and the fluid is used as an auxiliary medium through which the heat is transferred. The system has thermal inertia and requires the use of complicated gas distribution and sealing units. As the pressure inside the aforementioned heating/cooling chamber and the pressure in the vacuum processing chamber above the wafer are not in balance, the wafer should be positively fixed inside the substrate holder. This is done by means of a ring clamp. Without the use of such a clamp, the wafer would have been raised from its seat in the substrate holder.

More specifically, efficient transfer of heat requires that the gas inside the substrate holder, i.e., under the wafer W, be maintained under pressure substantially higher than the reduced pressure in the working chamber above the water W. This pressure difference deforms the membrane-like wafer with the convex part facing upward. In order to prevent this phenomenon, a gas under pressure should be supplied to the working chamber for pressure balance. This is not always allowed by the technological process and, even if possible, is time-consuming and requires the use of complicated process-sequence control.

OBJECTS AND SUMMARY OF THE INVENTION

It is an object of the present invention to provide a substrate holder with a substrate heater-cooler built into the body of the substrate holder with direct transfer of heat or cold from the heating/cooling medium to the substrate. It is another object to provide a substrate holder of the aforementioned type, wherein the substrate itself constitutes a wall that confines a part of the cooling/heating chamber. It is a further object of the invention to provide a substrate holder of the aforementioned type, wherein one and the same channel system is used for selective passage of a heating or a cooling medium. It is another object to provide a substrate holder of the aforementioned type, which may operate without positive clamping of the substrate in the substrate holder due to a small pressure difference above and below the substrate. Still another object is to provide a substrate holder of the aforementioned type which allows instantaneous change of temperature of the heating/cooling liquid. Still another object is to provide a substrate holder of the aforementioned type wherein the aforementioned channel system allows rapid replacement of a cooling/heating medium and hence the change of the temperature of the wafer. A further object is to provide a method of forming a chamber for a heating/cooling liquid in a substrate holder for electroless deposition, wherein a part of the aforementioned chamber is formed by the substrate itself.

A substrate holder has a disk-like body with a central recess having diameter smaller than the diameter of the substrate placed onto the upper surface of the holder. The substrate can be clamped in place by the clamps of the edge-grip mechanism or placed into a seat without the use of clamps. In both cases, the substrate forms a partial wall that confines the heating/cooling recess or chamber. The aforementioned recess is filled with a cooling or heating liquid (depending on the mode of metal deposition) selectively supplied from a liquid heating or cooling system. In order to ensure in the working chamber above the substrate a pressure slightly higher than the pressure in the cooling/heating recess, the working chamber is first filled with the working solution under the atmospheric pressure, and then the recess is filled with a heating or cooling liquid with simultaneous increase of pressure in the working chamber to a level slightly exceeding the pressure in the recess.

The substrate holder of the invention provides direct heat/cool-exchange between the heating/cooling medium and the substrate and allows instantaneous change of temperature of the heating/cooling liquid.

DETAIL DESCRIPTION OF THE INVENTION

Figure 1:
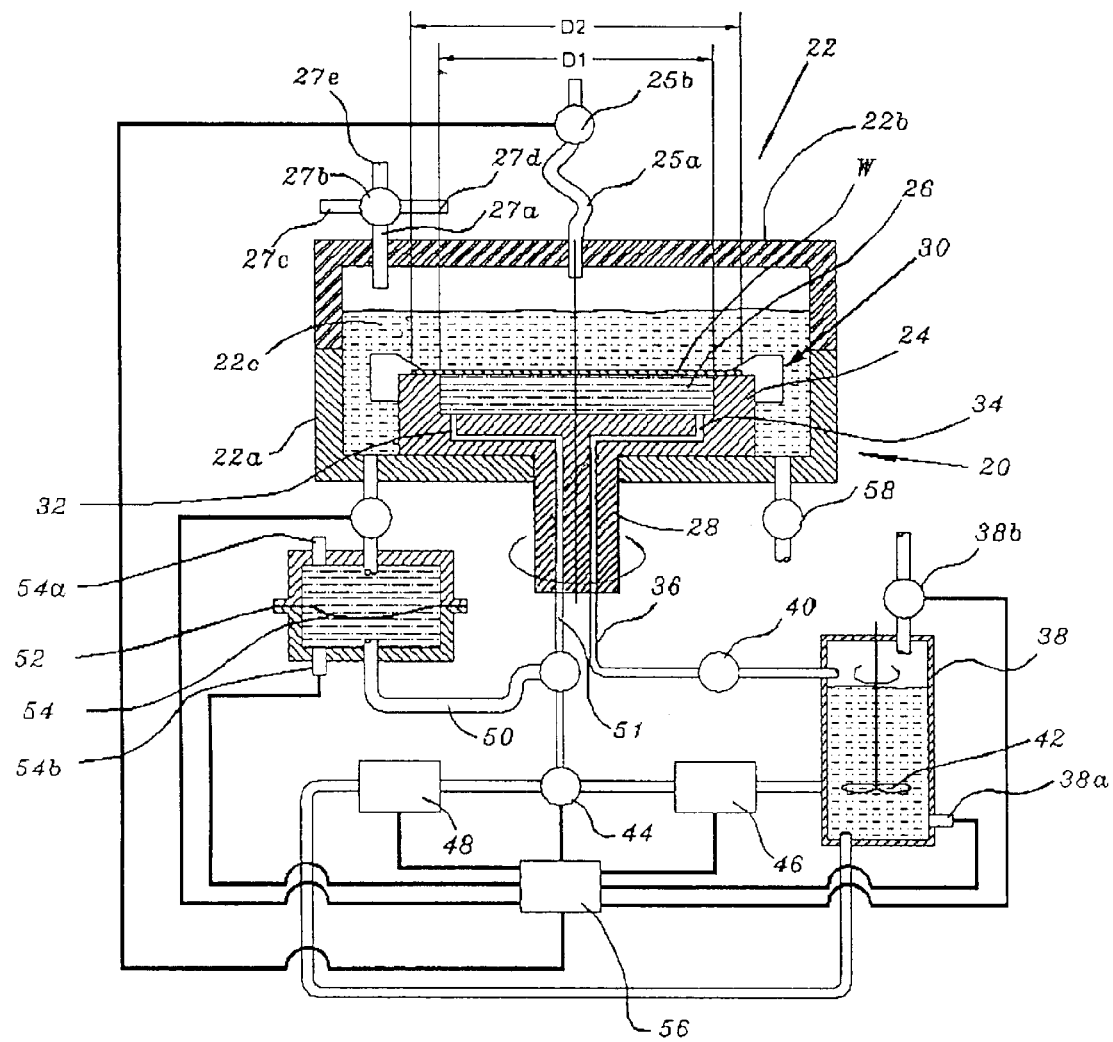
FIG. 1 is a schematic vertical cross-sectional view of a substrate holder made in accordance with one embodiment of the invention.

FIG. 1 is a schematic vertical cross-sectional view of a substrate holder 20 made in accordance with one embodiment of the invention. The substrate holder 20 is located in a sealable working chamber 22 of an electroless deposition apparatus (not shown), e.g., of the type described in pending U.S. patent application Ser. No. 10/103,015 submitted by the same applicants on Mar. 22, 2002. The working chamber 22 consists of a stationary lower cup-shaped part 22a having an open part facing upward and a moveable upper cup-shaped part 22b having its open facing down towards the opening of the lower part 22a. In a closed state shown in FIG. 1, both parts 22a and 22 of the working chamber 22 form a sealed space 22c.

Reference numeral 25a designates a first gas supply pipe, and reference numeral 25b designates a pressure control valve for controlling gas pressure inside the sealed space 22c.

Reference numeral 27a designates a fluid supply pipe equipped with a three-way valve 27b for selective supply of a working solution, water, or gas into the sealed space 22c. For this purpose, the valve 27b is connected to a working-solution supply pipe 27c, a water supply pipe 27d, and a gas supply pipe 27e. The pipe 27e may be used for the supply of air or a neutral gas such as dried nitrogen.

As shown in FIG. 1, the substrate holder 20 has a disk-like substrate holder body 24 with a central recess 26 having diameter D1 smaller than the diameter D2 of a substrate W. The holder 20 is rotated by means of a shaft 28, which may have the same construction and can be driven from the same drive mechanisms as described in aforementioned U.S. patent application Ser. No. 10/103,015.

The holder 20 is provided with an edge-grip mechanism 30, which may be of the same type as disclosed in aforementioned U.S. patent application Ser. No. 10/103,015.

The recess 26 has a recess inlet channel 32, which is formed inside the rotating shaft 28, e.g., along the central line of the shaft 28. The recess also has an outlet channel 34. Since the substrate holder 20 rotates, while the outlet channel is stationary, in FIG. 1 the passage 34 is shown conventionally, and connections between the moveable and stationary parts of the outlet unit are shown and described in more detail later. Reference numeral 38a designates a tank temperature control unit, e.g., a thermocouple. The tank 38 is connected to a small pump 38b which may be required for decrease of gas pressure in the tank 38.

The outlet channel 34 is connected by a pipe 36 to a cooling/heating liquid tank 38. Reference numeral 40 designates a cut-off valve. The inlet channel 32 is connected to a pipe 51, which links the channel 32 to the heater 46 or the cooler 48 via the two-way valve 44. The tank 38 is equipped with a stirrer 42.

The recess inlet channel 32 is connected to a two-way valve 44 and can be selectively connected to the heating/cooling liquid tank 38 via a heater 46 or a cooler 48. A pipe 50 branched from the recess inlet channel 32 is connected to a pressure differential control unit 52 intended for controlling a pressure ratio between the pressure of the working solution in the working chamber 22 and the pressure of the heating/cooling medium in the recess 26. The control unit 52 is a membrane-type device that has a membrane 54 with strain gages 54a and 54b which convert deformations of the membrane 54 into electrical signals sent to a controller 56. The control 56, in turn, is connected to actuating mechanisms (not shown) of the two-way valve 44, the heater 46, the cooler 48, the strain gages 54a, 54b, the thermocouple 38a, the pump 38b, and the control valve 25b.

Reference numeral 58 designates a solution return line with a valve for returning the working solution to the main reservoir of the electroless deposition apparatus.

Figure 2:
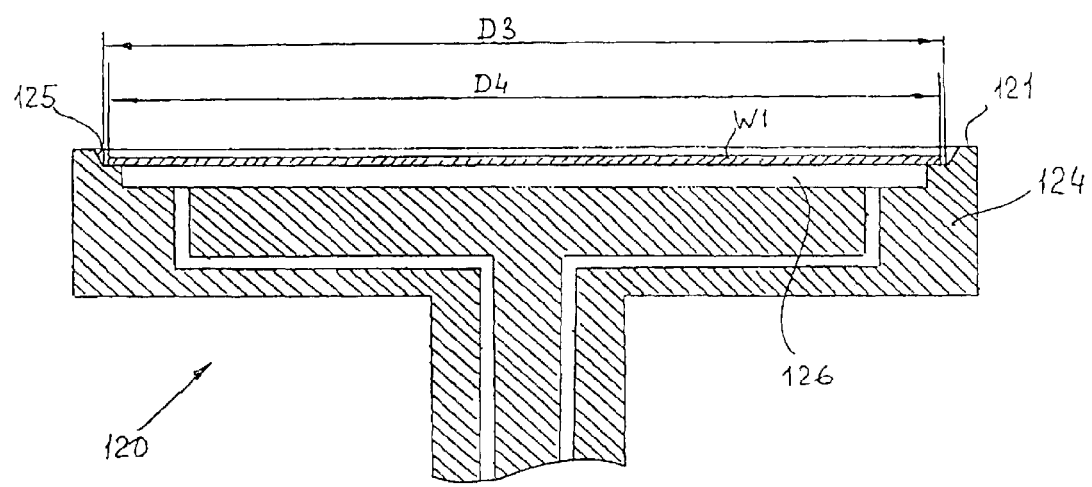
FIG. 2 is a sectional view of a substrate holder in accordance with another embodiment of the invention, where the holder does not use the substrate gripper and the substrate is secured due to pressure difference.

FIG. 2 illustrates a substrate holder 120 made in accordance with another embodiment of the invention. The substrate holder 120 of this embodiment differs from the substrate holder 20 of the embodiment of FIG. 1 by the absence of edge grippers 30. The upper end face 121 of the substrate holder body 124 has a shallow tapered boring 125, which forms a seat for the substrate W1. The diameter D3 on the bottom of the boring 125 is equal to or slightly greater than the diameter D4 of the waver W1, so that the wafer W1 can be placed into and centered in the boring 125. The rest of the construction of the substrate holder 120 is the same as that of the substrate holder of FIG. 1.

When the substrate W1 is placed into the boring 125, the pressures above the substrate, i.e., in the working chamber, is increased to a level slightly higher than the pressure inside the recess 126 and is sufficient for securing the substrate W1 on its seat and for sealing the heating/cooling recess 126.

It is understood that in this and in all other embodiments of the invention, the substrate holder is equipped with the substrate lifting/descending mechanism of the type shown in aforementioned U.S. patent application Ser. No. 10/103,015 and intended for loading of the substrate W into the substrate holder and for lifting it prior to unloading.

Figure 3:
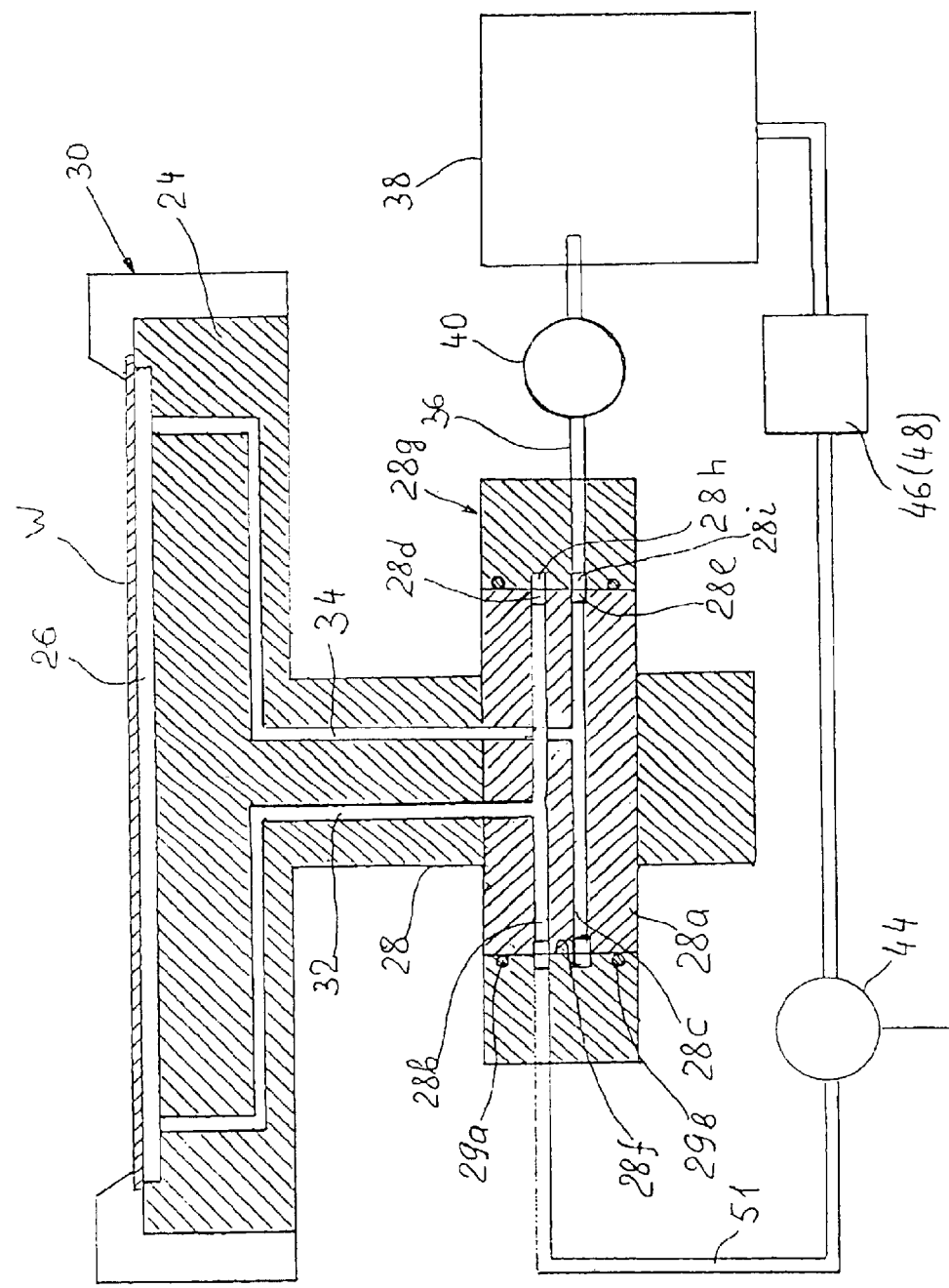
FIG. 3 is a more detailed sectional view of the substrate holder of FIG. 1 with illustration of interaction between the moveable and stationary parts of a cooling/heating liquid distribution system used in the substrate holder.

FIG. 3 illustrates interaction between the moveable and stationary parts of cooling/heating liquid distribution system used in the substrate holders 20 and 120 of both aforementioned embodiments (FIG. 1 and FIG. 2, respectively). Although reference numerals used in FIG. 3 are the same as those of FIG. 1, it is understood that they are equally applicable to the parts and elements of FIG. 2.

As has been mentioned above, in FIG. 1 the channel 34 is shown conventionally. As illustrated in FIG. 3, the heating/cooling liquid outlet channel 34, as well as the heating/cooling liquid inlet channel 32 can be both formed in the rotating shaft 28. The lower part 28a of the shaft 28 is made with an increased diameter and contains transverse channels 28b and 28c, which are open into annular recesses 28d and 28e, respectively, formed on the outer periphery of the shaft part 28a. The shaft part 28a is slidingly inserted into the opening 28f of a stationary part 28g. The stationary part 28g has annular recesses 28h and 28i, which are aligned with respective recesses 28d and 28c of the rotating shaft part 28a The common chambers formed by the recesses 28d, 28h and the recesses 28e, 28i are sealed by seal rings 29a and 29b (FIG. 3) and are to the respective pipe 51 and the pipe 36 (FIGS. 1 and 3). The rest of the system is the same as in FIG. 1.

The system of FIG. 3 makes it possible to supply the heating/cooling liquid from the tank 38 to the recess 26 via the heater 46 or the cooler 48 through the two-way valve 44 controlled by the controller 56 (FIG. 1).

Figure 4:
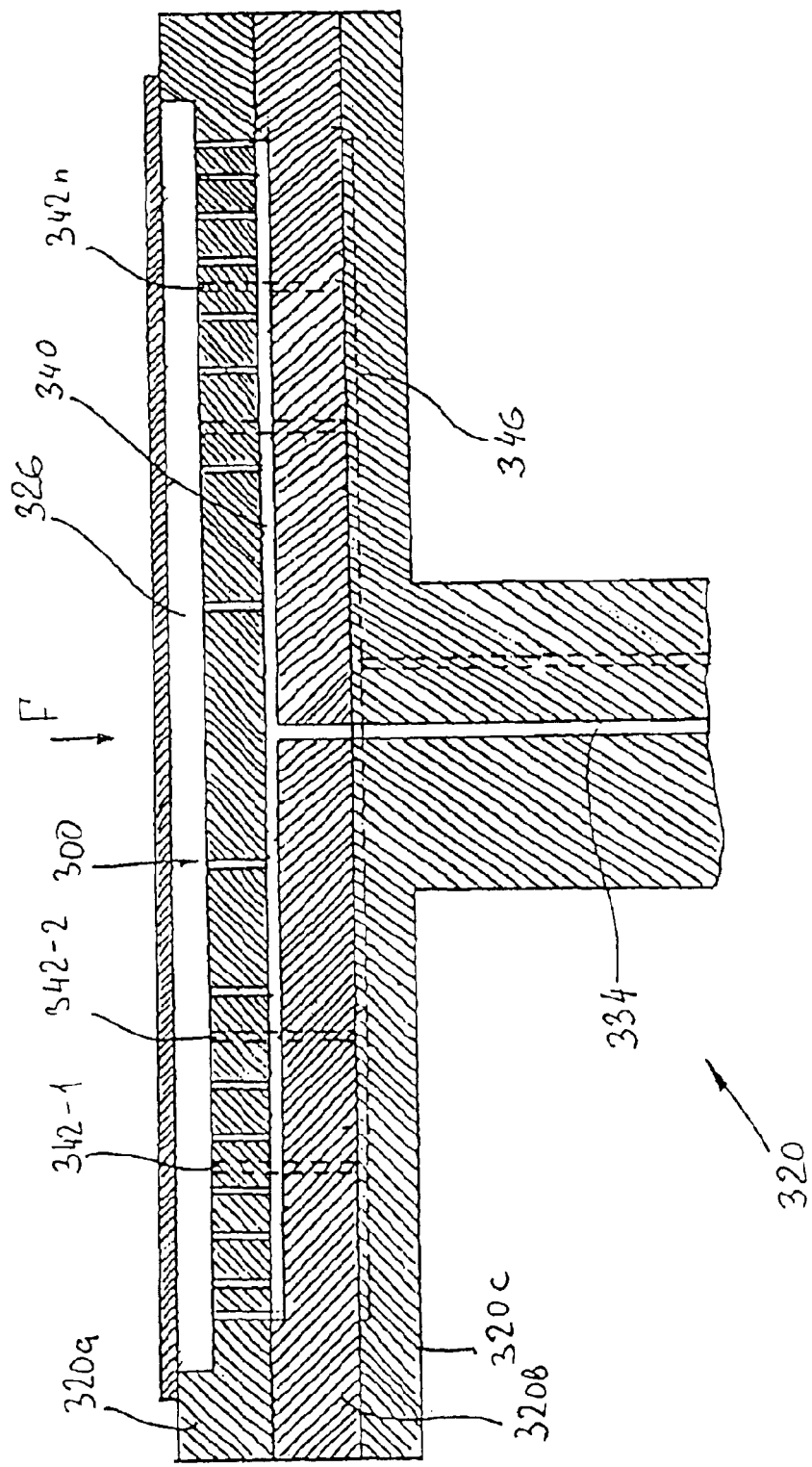
FIG. 4 is a sectional view of a substrate holder of another embodiment with a bottom shower system that allows uniform supply/removal of the heating/cooling medium into/from the recess through the bottom of the holder.
Figure 5:
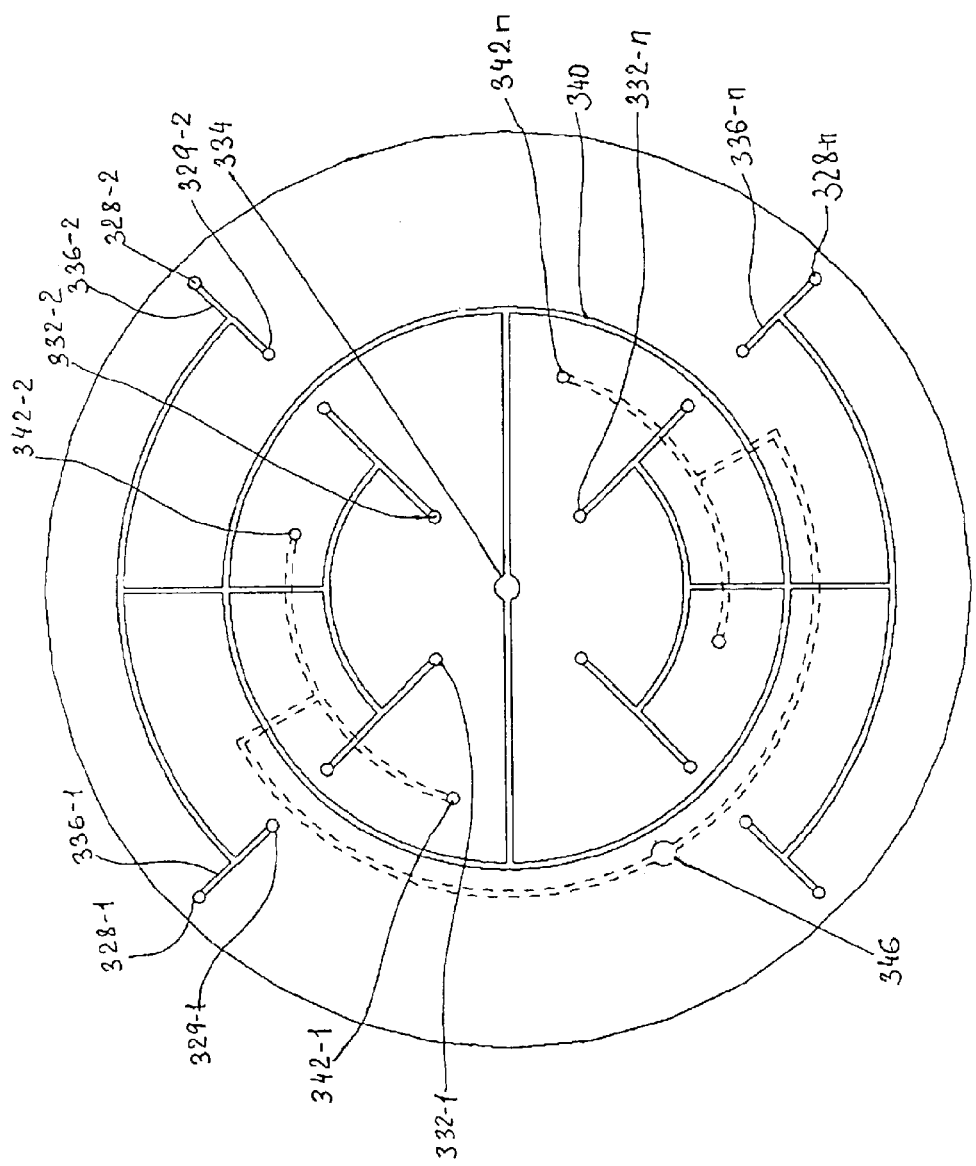
FIG. 5 is a top view on the bottom of the recess illustrating the arrangement of perforations and channels used in the bottom shower of FIG. 4.

In the embodiment shown in FIG. 4, a substrate holder 320 is equipped with a bottom shower system 300 that allows uniform supply/removal of the heating/cooling medium into/from the recess 326 through the bottom of the holder. More specifically, FIG. 4 is a side sectional view of the substrate holder 320. FIG. 5 is a top view on the bottom of the recess 326 in the direction of arrow F of FIG. 4. As can be seen from FIGS. 4 and 5, the substrate holder 320 has a plurality of uniformly distributed perforations. In the illustrated embodiment, the perforations are arranged circumferentially on conventional concentric circles. More specifically, the outermost circle contains perforations 328-1, 328-2 ... 328-n. The next concentric circle of a smaller diameter contains perforations 329-1, 329-2, ... 329-n, while the innermost circle contains perforations 332-1, 332-2, ... 332-n. It is understood that circumferential arrangement of the perforations is given only as an example and that any other arrangement and cross-section of the perforations is possible, provided that these perforations supply essentially equal volumes of the heating/cooling medium to equal surface areas of the recess bottom, preferably with equal velocities of the inflows.

As shown in FIGS. 4 and 5, the substrate holder 320 has a central medium supply opening 334 which is connected to a heating/cooling medium tank 38 via the heater 46 or cooler 48, the two-way valve 44, and the channel 51 (FIG. 1). The central medium supply opening 334 is connected to each aforementioned perforation 328-1, 328-2, ... 328-n, 329-1, etc. via individual channels 336-1, 336-2, 336-n, etc. Reference numeral 340 designates a main distribution channel which consists of circumferential and radial sections connected into a single medium supply system for the supply of the heating/cooling medium to local subchannels, which are linked to the respective perforations.

It can be seen from FIG. 4 that the substrate holder 320 is assembled from three parts 320a, 320b, and 320c which are stacked one onto the other. The aforementioned main distribution channel 340 is cut in the surface of the part 320b, while the perforations 328-1, 328-2, ... 328-n, 329-1, etc. are drilled through the body of the part 320a so as to be aligned with the respective sections of the main distribution channel 340.

It is understood that the heating/cooling medium has to be not only uniformly delivered to the recess 326 but also uniformly removed from this recess with the same flow rate with which is was delivered to the recess. The medium removal function is fulfilled by a system of medium removal perforations 342-1, 342-2, . . . 342-n. It is preferable that the medium removal perforations are uniformly distributed between the medium supply perforations 328-1, 328-2 . . . 328-n, 329-1, etc. and have cross-sections that provide removal of equal volumes of the heating/cooling medium from equal surface areas on the bottom of the recess 326.

As shown in FIG. 4, the medium removal perforations 342-1, 342-2 . . . 342-n are drilled from the bottom of the recess 326 to the medium outlet channel 346 which is cut in the surface of the part 320c and is connected to the heating/cooling medium tank 38 via the heater 46 or cooler 48, the two-way valve 44, and the channel 36 (FIG. 1). As has been mentioned above, in FIG. 1 the channel 36 is shown conventionally as the liquid will be delivered and removed through the moveable and stationary portions of the holder shown in FIG. 3.

Operation

In order to prevent formations of gas bubbles in the recess 26 under a substrate W, prior to placement of the substrate into the substrate holder 20, the latter is first filled with a liquid, e.g., with the cooling or heating liquid (depending on the selected mode of rectal deposition) to the level exceeding the upper edge of the recess 26, and only after that the substrate is placed into the holder 20 and, if necessary, is clamped in the holder 20 (FIG. 1) (320 - FIG. 4). The working chamber 22 is then filled with the working solution. The deposition process is carried out by precipitation of the coating material from the working solution, while the temperature on the surface of the substrate W is controlled by continuing the supply of the heating/cooling medium to the recess 26 (326). The liquid is uniformly removed from the recess 26 (326) through the medium removal perforations 342-1, 342-2 . . . 342-n drilled from the bottom of the recess 326 to the medium outlet channel 346 cut in the surface of the part 320c.

In order to ensure balance of the pressure inside the recess 26 (326), pressure developed in the working chamber above the substrate W (FIG. 1) can be adjusted by means of gas supplied, e.g., through the gas supply line 25a (FIG. 1), to a value equal to or slightly exceeding the pressure of liquid in the recess 26 (326) on the back side of the substrate W. The pressure in the recess is controlled by the pressure differential control unit 52 (FIG. 1) equipped with the strain gages 54a and 54b which convert deformations of the membrane 54 into electrical signals sent to a controller 56. The controller 56, in turn, is connected to actuating mechanisms (not shown) of the two-way valve 44, the heater 46, the cooler 48, the strain gages 54a, 54b, the thermocouple 38a, the pump 38b, and the control valve 25b. During the operation, the pressure of the working solution in the working chamber 22 above the substrate W is always maintained at a level slightly higher than the pressure inside the recess. This allows performing fixation of the substrate W in the substrate holder 20 without the use of a clamping mechanism, if the holder corresponds to the embodiment shown in FIG. 2.

The use of a heater-cooler of the type shown in FIGS. 1–5 provides extremely high temperature uniformity over the entire substrate W with the temperature of the solution kept constant. Such uniformity of heating or cooling results from the heat-exchange conditions between the substrate W, the solution in the working chamber 22, and the heating/cooling medium in the recess 26.

Thus it has been shown that the invention provides a substrate holder with a substrate heater-cooler built into the body of the substrate holder with direct transfer of heat or cold from the heating/cooling medium to the substrate. The substrate holder itself constitutes a wall that confines a part of the cooling/heating chamber. One and the same channel system is used for selective passage of a heating or a cooling medium. The substrate holder of the invention can operate without positive clamping due to a small pressure difference above and below the substrate. The substrate holder of the invention allows instantaneous change of temperature of the heating/cooling liquid. A part of the heating/cooling chamber is formed by the substrate itself. The invention also provides a method of direct heating/cooling of a substrate in a process of electroless deposition with the use of the temperature-controlled substrate holder.

The invention has bean shown and described with reference to specific embodiments, which should be construed only as examples and do not limit the scope of practical applications of the invention. Therefore any changes and modifications in technological processes, constructions, materials, shapes, and their components are possible, provided these changes and modifications do not depart from the scope of the patent claims. As has been mentioned above, the invention is not limited to electroless plating is applicable to any treatment of a workpiece in a fluid such as electroplating, processing in a chemical solution, such as soaking, rinsing in water, polishing in a liquid slurry used in chemical mechanical polishing, electropolishing, or the like. The process can be carried out under increased pressures for use of high-pressure process advantages such as suppression of gas evolution. The perforations and channels in the heating/cooling medium delivery and removal systems shown in FIGS. 4 and 5 may have configurations and arrangements different from those shown in the aforementioned drawings. For example, the perforations drilled in the recess bottom may be arranged on squares instead of circles or may have a hexagonal arrangement with the use of auxiliary intermediate volume leveling channels or chambers formed inside the substrate holder to ensure equalization of pressures on the inputs and outputs of the medium in and from the recess. In the embodiment where the substrate is positively clamped in the holder by the edge grippers or the like, the pressure in the recess can be greater than the pressure in the working chamber. The outlet openings can be formed not only on the bottom of the recess, but also in the side wall of the recess, so that the substrate can be first placed into a dry holder, the recess can then be filled with the heating/cooling liquid, the deposition chamber is filled with the working solution, and if the gas bubbles are formed under the substrate, they can be eliminated due to removal of the heating/cooling liquid through the outlet openings formed in the upper part of the recess side wall.

What we claim is:

1. A temperature-controlled substrate holder for holding a substrate in an apparatus for processing in a fluid, said apparatus having a sealable working chamber for said fluid, means for the supply of at least one fluid to said sealable working chamber, and means for controlling pressure in said sealable working chamber, said temperature-controlled substrate holder comprising:

a substrate holder body located in said sealable working chamber, said holder having an upwardly facing flat surface, said substrate having a diameter, said upwardly facing flat surface having a recess with a diameter smaller than said diameter of said substrate, said upwardly facing flat surface being intended for supporting said substrate during said processing in a position, in which said substrate closes said recess; and means for the supply of a heating/cooling medium to said recess comprising storage means for said heating/cooling medium, a heater, a cooler, and means for selectively switching the path of said heating/cooling medium from said storage means to said recess through said heater or said cooler.

2. The temperature-controlled substrate holder of claim 1, further comprising means for controlling a pressure ratio between the pressure of said at least one fluid in said sealable working chamber and the pressure of said heating/cooling medium in said recess.

3. The temperature-controlled substrate holder of claim 2, wherein said means for controlling a pressure ratio comprises a pressure differential control unit which maintains the pressure of said at least one fluid in said sealable working chamber at a level higher than said pressure of said heating/cooling medium in said recess.

4. The temperature-controlled substrate holder of claim 2, further comprising controller means for controlling said switching, wherein said means for selectively switching the path of said heating/cooling medium comprises a switchable two-way valve, said controller means being connected to said switchable two-way valve, said heater, said cooler, and to said means for controlling pressure ratio.

5. The temperature-controlled substrate holder of claim 1, further comprising means for fixation of said substrate in said temperature-controlled substrate holder.

6. The temperature-controlled substrate holder of claim 1, wherein said recess has an upwardly facing tapered edge of a diameter exceeding said diameter of said substrate for use as a seat for said substrate in said temperature-controlled substrate holder.

7. The temperature-controlled substrate holder of claim 1, further provided with means for uniform delivery of a predetermined volume of said heating/cooling medium to said recess from said storage means through said heater or cooler and for simultaneous uniform removal of said volume of said heating/cooling medium from said recess to said storage means.

8. The temperature-controlled substrate holder of claim 7, wherein said means for uniform delivery and for simultaneous uniform removal comprises a plurality of substantially horizontal medium delivery channels formed in said substrate holder body, a central supply opening having one end connected to said plurality of substantially horizontal medium delivery channels and another end to a switchable two-way valve, and a plurality of substantially vertical channels formed in said substrate holder body and connecting respective channels of said plurality of substantially horizontal medium delivery channels to said recess.

9. The temperature-controlled substrate holder of claim 1, further comprising means for rotation of said temperature-controlled substrate holder inside said sealable working chamber of said apparatus, said means for rotation comprising a rotating part rigidly connected to said substrate holder body, and a stationary part within which said rotating part rotates.

10. The temperature-controlled substrate holder of claim 9, further comprising sealing means located between said stationary part and said rotating part, said rotating part having a first annular recess communicating with a switchable two-way valve, said rotating part having a second annular recess aligned with said first annular recess and forming therewith common annular chambers sealed due to the use of said sealing means, said means for uniform delivery and for simultaneous uniform removal comprising a plurality of substantially horizontal medium delivery channels formed in said substrate holder body, a central supply opening formed in said rotating part having one end connected to said plurality of substantially horizontal medium delivery channels and another end to said switchable two-way valve via said common annular chambers, and a plurality of substantially vertical channels formed in said substrate holder body and connecting respective channels of said plurality of substantially horizontal medium delivery channels to said recess.

11. A temperature-controlled substrate holder for holding a substrate in an holder apparatus for processing in a fluid, said apparatus having a sealable working chamber for the fluid and means for the supply of at least one working solution to said sealable working chamber, means for controlling pressure in said sealable working chamber, said temperature-controlled substrate holder comprising:

a substrate holder body located in said sealable working chamber, said holder having an upwardly facing flat surface, said substrate having a diameter, said upwardly facing flat surface having a recess with a diameter smaller than said diameter of said substrate, said upwardly facing flat surface being intended for supporting said substrate during said processing in a position, in which said substrate closes said recess;

means for the supply of a heating/cooling medium to said recess; and means for rotating said substrate holder comprising a rotating part rigidly connected to said substrate body, and a stationary part within which said rotating part rotates.

12. The temperature-controlled substrate holder of claim 11, further comprising means for controlling pressure ratio between the pressure of said working solution in said sealable working chamber and the pressure of said heating/cooling medium in said recess.

13. The temperature-controlled substrate holder of claim 12, wherein said means for controlling pressure ratio comprises a pressure differential control unit which maintains the pressure of said working solution in said sealable working chamber at a level higher than said pressure of said heating/cooling medium in said recess.

14. The temperature-controlled substrate holder of claim 11, further comprising means for fixation of said substrate in said temperature-controlled substrate holder.

15. The temperature-controlled substrate holder of claim 11, wherein said recess has an upwardly facing tapered edge of a diameter exceeding said diameter of said substrate for use as a seat for said substrate in said temperature-controlled substrate holder.

16. The temperature-controlled substrate holder of claim 11, wherein said means for the supply of a heating/cooling medium to said recess comprises storage means for said heating/cooling medium, a combination of a heater and a cooler, and means for selectively switching the path of said healing/cooling medium to said recess from said storage means to said recess through said heater or said cooler.

17. The temperature-controlled substrate holder of claim 16, further comprising controller means for controlling said switching, means for selectively switching the path of said healing/cooling medium comprising a switchable two-way valve, said controller being connected to said switch able two-way valve, said heater, said cooler, and to a means for controlling a pressure ratio between the pressure of said working solution in said sealable working chamber and the pressure of said heating/cooling medium in said recess.

18. The temperature-controlled substrate holder of claim 17, further provided with means for uniform delivery of a predetermined volume of said heating/cooling medium to said recess from said storage means through said heater or cooler and for simultaneous uniform removal of said volume of said heating/cooling medium from said recess to said storage means.

19. The temperature-controlled substrate holder of claim 18, wherein said means for uniform delivery and for simultaneous uniform removal comprises a plurality of substantially horizontal medium delivery channels formed in said substrate holder body, a central supply opening having one end connected to said plurality of substantially horizontal medium delivery channels and another end to said switchable two-way valve, and a plurality of substantially vertical channels formed in said substrate holder body and connecting respective channels of said plurality of substantially horizontal medium delivery channels to said recess.

20. The temperature-controlled substrate holder of claim 18, further comprising sealing means located between said stationary part and said rotating part, said rotating part having a first annular recess communicating with a switchable two-way valve, said rotating part having a second annular recess aligned with said first annular recess and forming therewith common annular chambers sealed due to the use of said sealing means, said means for uniform delivery and for simultaneous uniform removal comprising a plurality of substantially horizontal medium delivery channels formed in said substrate holder body, a central supply opening formed in said rotating part having one end connected to said plurality of substantially horizontal medium delivery channels and another end to said switchable two-way valve via said common annular chambers, and a plurality of substantially vertical channels formed in said substrate holder body and connecting respective channels of said plurality of substantially horizontal medium delivery channels to said recess.

* * * * *

UNITED STATES PATENT AND TRADEMARK OFFICE
CERTIFICATE OF CORRECTION

PATENT NO. : 6,908,512 B2
DATED : June 21, 2005
INVENTOR(S) : Ivanov et al.

It is certified that error appears in the above-identified patent and that said Letters Patent is hereby corrected as shown below:

<u>Title page,</u>
Item [74], *Attorney, Agent, or Firm*, delete "Mollie E. Leitang" and substitute -- Mollie E. Lettang --.

Signed and Sealed this

Twenty-third Day of May, 2006

JON W. DUDAS
*Director of the United States Patent and Trademark Office*